(12) United States Patent
Kim et al.

(10) Patent No.: US 9,912,330 B2
(45) Date of Patent: Mar. 6, 2018

(54) CONTROL CIRCUITS OF COLLECTOR CURRENT OF SUBSTRATE BIPOLAR JUNCTION TRANSISTORS AND CIRCUITS OF COMPENSATING FOR BASE CURRENT FOR GENERATING A PROPORTIONAL TO ABSOLUTE TEMPERATURE (PTAT) VOLTAGE USING THE CONTROL CIRCUITS

(71) Applicants: SK hynix Inc., Icheon-si, Gyeonggi-do (KR); INDUSTRIAL COOPERATION FOUNDATION CHONBUK NATIONAL UNIVERSITY, Jeonju-si, Jeollabuk-do (KR)

(72) Inventors: Hee Jun Kim, Icheon-si (KR); Sang Won Lee, Seongnam-si (KR); Hang Geun Jeong, Jeonju-si (KR)

(73) Assignees: SK hynix Inc., Icheon-si (KR); INDUSTRIAL COOPERATION FOUNDATION CHONBUK NATIONAL UNIVERSITY, Jeonju-si, Jeollabuk-do (KR)

(*) Notice: Subject to any disclaimer, the term of this patent is extended or adjusted under 35 U.S.C. 154(b) by 0 days.

(21) Appl. No.: 15/421,055

(22) Filed: Jan. 31, 2017

(65) Prior Publication Data
US 2018/0006642 A1 Jan. 4, 2018

(30) Foreign Application Priority Data
Jul. 1, 2016 (KR) .................. 10-2016-0083617

(51) Int. Cl.
*H03K 3/00* (2006.01)
*H03K 17/567* (2006.01)
(Continued)

(52) U.S. Cl.
CPC ....... *H03K 17/567* (2013.01); *H01L 29/0821* (2013.01); *H01L 27/0623* (2013.01)

(58) Field of Classification Search
None
See application file for complete search history.

(56) References Cited

U.S. PATENT DOCUMENTS 5,774,020 A * 6/1998 Kimura ................. H03F 1/3211
327/359
6,198,343 B1 * 3/2001 Matsuoka ............... G05F 3/262
323/315

(Continued)

*Primary Examiner* — Cassandra Cox
(74) *Attorney, Agent, or Firm* — William Park & Associates Ltd.

(57) ABSTRACT

A circuit for controlling a collector current of a substrate bipolar junction transistor (BJT) is provided. The circuit includes a first current mirror configured to generate a first mirroring base current corresponding to a replicate current of a base current of the substrate BJT, a current transmitter configured to transmit the first mirroring base current, a second current mirror configured to generate a second mirroring base current corresponding to a replicate current of the first mirroring base current received from the current transmitter and configured to supply the second mirroring base current to an emitter of the substrate BJT, and a current source configured to supply a drive current corresponding to a collector current of the substrate BJT to the emitter of the substrate BJT.

22 Claims, 2 Drawing Sheets

(51) Int. Cl.
  *H01L 29/08* (2006.01)
  *H01L 27/06* (2006.01)

(56) References Cited

U.S. PATENT DOCUMENTS

| | | | |
|---|---|---|---|
| 2001/0033239 A1* | 10/2001 | Mori | H03K 17/04113 |
| | | | 341/133 |
| 2007/0115042 A1 | 5/2007 | McLeod et al. | |
| 2016/0190992 A1* | 6/2016 | Ridgers | H03F 1/302 |
| | | | 330/296 |

\* cited by examiner

CONTROL CIRCUITS OF COLLECTOR CURRENT OF SUBSTRATE BIPOLAR JUNCTION TRANSISTORS AND CIRCUITS OF COMPENSATING FOR BASE CURRENT FOR GENERATING A PROPORTIONAL TO ABSOLUTE TEMPERATURE (PTAT) VOLTAGE USING THE CONTROL CIRCUITS

CROSS-REFERENCE TO RELATED APPLICATION

The present application claims priority under 35 U.S.C. 119(a) to Korean Application No. 10-2016-0083617, filed on Jul. 1, 2016, which is herein incorporated by reference in its entirety.

BACKGROUND

1. Technical Field

Various embodiments of the present disclosure relate to circuits having substrate bipolar junction transistors, and more particularly, to control circuits of collector currents of substrate bipolar junction transistors and circuits for compensating base currents for generating a proportional to absolute temperature (PTAT) voltage using the control circuits.

2. Related Art

In general, bipolar junction transistors (BJTs) are well known as circuit elements having an excellent junction characteristic as compared with metal-oxide-semiconductor (MOS) transistors. The BJTs may be required in some semiconductor circuits to execute a specific function. Thus, it may be necessary to realize a semiconductor including the MOS transistors and the BJTs using a single process technology. A bipolar-complementary MOS (BiCMOS) process technology has been widely used to integrate CMOS elements and BJTs into a single device. However, the BiCMOS process technology may involve high fabrication costs and a long development time. Moreover, if the BJTs are realized using a CMOS process technology, characteristics of the BJTs may be degraded. Particularly, if substrate BJTs are realized using a CMOS process technology, it may be difficult to directly control a collector current of the substrate BJTs because collectors of the substrate BJTs are disposed in a substrate. Accordingly, circuits for controlling the collector current of the substrate BJTs may be required in various circuits such as temperature sensors or reference voltage generators.

SUMMARY

Various embodiments are directed to control circuits of collector currents of substrate BJTs and circuits of compensating for base currents for generating a PTAT voltage using the control circuits.

According to an embodiment, there is provided a circuit for controlling a collector current of a substrate BJT. The circuit includes a first current mirror configured to generate a first mirroring base current corresponding to a replicate current of a base current of the substrate BJT, a current transmitter configured to transmit the first mirroring base current, a second current mirror configured to generate a second mirroring base current corresponding to a replicate current of the first mirroring base current received from the current transmitter and configured to supply the second mirroring base current to an emitter of the substrate BJT, and a current source configured to supply a drive current corresponding to a collector current of the substrate BJT to the emitter of the substrate BJT.

According to another embodiment, there is provided a circuit for compensating a base current for generating a PTAT voltage. The circuit includes a first current mirror configured to supply a first collector current corresponding to a collector current of a first substrate bipolar junction transistor (BJT) to an emitter of the first substrate BJT, a second current mirror configured to generate a first mirroring base current corresponding to a replicate current of a base current of the first substrate BJT, a current transmitter configured to transmit the first mirroring base current, a third current mirror configured to generate a second mirroring base current corresponding to a replicate current of the first mirroring base current received from the current transmitter to supply the second mirroring base current to the emitter of the first substrate BJT and configured to generate a third mirroring base current having an amount which is equal to "N" (wherein, "N" denotes a natural number which is greater than one) times an amount of the first mirroring base current to supply the third mirroring base current to an emitter of a second substrate BJT, and a second collector current transmitter configured to supply a second collector current to the emitter of the second substrate BJT where the second collector current amount is equal to "N" times an amount of the first collector current.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
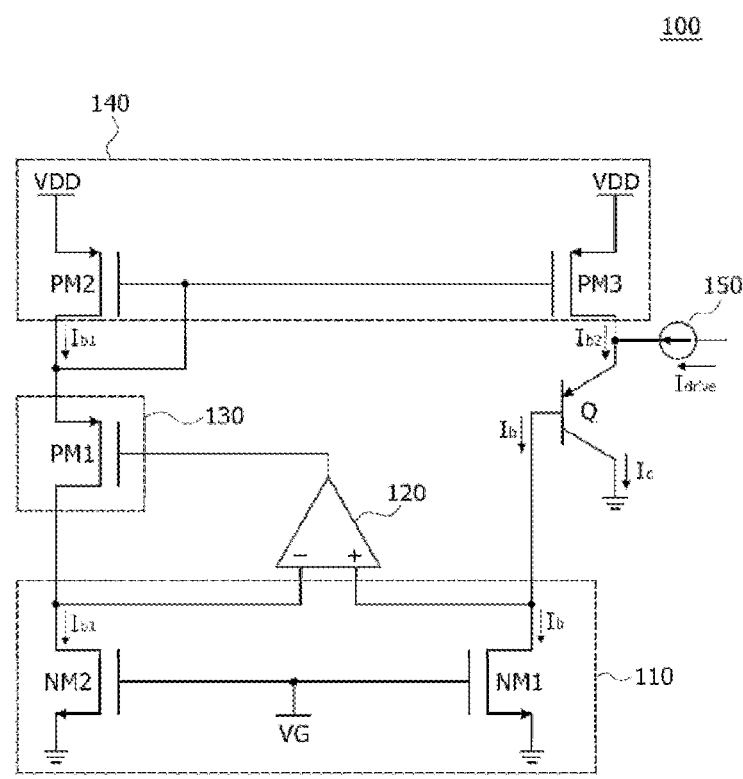
FIG. 1 is circuit diagram illustrating a circuit for controlling collector currents of substrate BJTs according to an embodiment.

The present disclosure will be described below with reference to the accompanying drawings through various embodiments.

The present disclosure, however, may be embodied in various different forms, and should not be construed as being limited to the illustrated embodiments herein. Rather, these embodiments are provided as examples so that this disclosure will be thorough and complete, and will fully convey various aspects and features of the present disclosure to those skilled in the art.

It will be understood that, although the terms "first", "second", "third", and so on may be used herein to describe various elements, these elements are not limited by these terms. These terms are used to distinguish one element from another element. Thus, a first element described below could also be termed a second or third element without departing from the spirit and scope of the present disclosure.

The drawings are not necessarily to scale and, in some instances, proportions may have been exaggerated in order to clearly illustrate features of the embodiments.

The terminology used herein is for the purpose of describing particular embodiments only and is not intended to be limiting of the present disclosure. As used herein, singular forms are intended to include the plural forms as well, unless the context clearly indicates otherwise. It will be further understood that the terms "comprises", "comprising", "includes", and "including" when used in this specification, specify the presence of the stated elements and does not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with the terms' meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

In addition, when an element is referred to as being located "on", "over", "above", "under", or "beneath" another element, it is intended to mean relative positional relationship, but not be used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

FIG. 1 is circuit diagram illustrating a circuit 100 for controlling a collector current of a substrate BJT according to an embodiment. Referring to FIG. 1, the circuit 100 may be configured to include a substrate BJT Q, a first current mirror 110, an operational amplifier 120, a current transmitter 130, a second current mirror 140, and a current source 150. A base of the substrate BJT Q may be coupled to the first current mirror 110. An emitter of the substrate BJT Q may be coupled to the second current mirror 140 and the current source 150. A collector of the substrate BJT Q may be coupled to a ground terminal. In some embodiments, the substrate BJT Q may be a PNP BJT. Alternatively, the substrate BJT Q may be an NPN BJT. In the event that the substrate BJT Q is an NPN BJT, each of MOS transistors described in this embodiment may be construed to have an opposite channel type.

The first current mirror 110 may include a first NMOS transistor NM1 and a second NMOS transistor NM2. The first and second NMOS transistors NM1 and NM2 may have the same current drivability. For example, the first and second NMOS transistors NM1 and NM2 may have the same transconductance (Gm). A gate of the first NMOS transistor NM1 may be coupled to a gate of the second NMOS transistor NM2, and a gate bias voltage VG may be applied to the gates of the first and second NMOS transistors NM1 and NM2. Sources of the first and second NMOS transistors NM1 and NM2 may be coupled to the ground terminal. A drain of the first NMOS transistor NM1 may be coupled to the base of the substrate BJT Q and a non-inverting input terminal of the operational amplifier 120. A drain of the second NMOS transistor NM2 may be coupled to an inverting input terminal of the operational amplifier 120 and the current transmitter 130. The first current mirror 110 may be realized so that a drain voltage of the first NMOS transistor NM1 is equal to a drain voltage of the second NMOS transistor NM2. Thus, a base current $I_b$ of the substrate BJT Q may flow through the first NMOS transistor NM1, and a first mirroring base current $I_{b1}$ corresponding to a duplicate current of the base current $I_b$ may flow through the second NMOS transistor NM2.

The operational amplifier 120 may be used in equalization of the drain voltages of the first and second NMOS transistors NM1 and NM2 constituting the first current mirror 110. Specifically, the operational amplifier 120 may be disposed to provide a negative feedback loop so that an output signal of the operational amplifier 120 is applied to the current transmitter 130. The operational amplifier 120 and the current transmitter 130 may operate to equalize a voltage of the inverting input terminal of the operational amplifier 120 with a voltage of the non-inverting input terminal of the operational amplifier 120. Thus, the inverting input terminal and the non-inverting input terminal of the operational amplifier 120 may have the same voltage level. As a result, the drains of the first and second NMOS transistors NM1 and NM2 may have the same voltage level.

The current transmitter 130 may include a first PMOS transistor PM1. A gate of the first PMOS transistor PM1 of the current transmitter 130 may be coupled to an output terminal of the operational amplifier 120. A source of the first PMOS transistor PM1 may be coupled to the second current mirror 140. A drain of the first PMOS transistor PM1 may be coupled to the drain of the second NMOS transistor NM2 and the inverting input terminal of the operational amplifier 120. The first PMOS transistor PM1 may be disposed so that the operational amplifier 120 constitutes a negative feedback loop. In addition, the first PMOS transistor PM1 of the current transmitter 130 may be disposed to transmit the first mirroring base current $I_{b1}$ to the second current mirror 140, where the first mirroring base current $I_{b1}$ may be generated by the first current mirror 110.

The second current mirror 140 may include a second PMOS transistor PM2 and a third PMOS transistor PM3. A gate of the second PMOS transistor PM2 may be coupled to a gate of the third PMOS transistor PM3. Sources of the second and third PMOS transistors PM2 and PM3 may be coupled to a supply voltage VDD terminal. A drain of the second PMOS transistor PM2 may be coupled to the source of the first PMOS transistor PM1 constituting the current transmitter 130. The second PMOS transistor PM2 may have a diode-connected structure in which the gate and the drain of the second PMOS transistor PM2 are connected to each other. A drain of the third PMOS transistor PM3 may be coupled to the emitter of the substrate BJT Q. In some embodiments, the second and third PMOS transistors PM2 and PM3 may have the same current drivability. For example, the second and third PMOS transistors PM2 and PM3 may have the same transconductance (Gm). The third PMOS transistor PM3 may generate a second mirroring base current $I_{b2}$ corresponding to a duplicate current of the first mirroring base current $I_{b1}$ flowing through the second PMOS transistor PM2.

The current source 150 may be coupled to the emitter of the substrate BJT Q. The current source 150 may supply a drive current $I_{drive}$ to the emitter of the substrate BJT Q. Accordingly, the second mirroring base current $I_{b2}$ generated by the second current mirror 140 and the drive current $I_{drive}$ outputted from the current source 150 may be supplied to the emitter of the substrate BJT Q.

An operation of the circuit 100 for controlling a collector current of the substrate BJT Q will be described hereinafter. First, if the supply voltage VDD and the drive current $I_{drive}$ are applied to the circuit 100, the base current $I_b$ of the substrate BJT Q may flow through the first NMOS transistor NM1 of the first current mirror 110. Because the operational amplifier 120 constitutes a negative feedback loop, the drains of the first and second NMOS transistors NM1 and NM2 may have the same voltage level. As a result, the first mirroring base current $I_n$, corresponding to a duplicate current (i.e., a replicate current) of the base current $I_b$ of the substrate BJT Q, may flow through the second NMOS transistor NM2. If the first mirroring base current $I_{b1}$ flows through the second NMOS transistor NM2, the first mirroring base current $I_{b1}$ may also flow through the second PMOS transistor PM2 due to the presence of the first PMOS transistor PM1 of the current transmitter 130.

The first mirroring base current $I_{b1}$ may be replicated in the second current mirror 140 to generate the second mirroring base current $I_{b2}$ flowing through the third PMOS transistor PM3. The second mirroring base current $I_{b2}$ generated by the third PMOS transistor PM3 and the drive current $I_{drive}$ outputted from the current source 150 may flow into the emitter of the substrate BJT Q. The second mirroring base current $I_{b2}$ may correspond to a replicate current of the base current $I_b$ of the substrate BJT Q. Thus, an amount of the second mirroring base current $I_{b2}$ may be substantially equal to an amount of the base current $I_b$ of the substrate BJT Q. As a result, the collector current $I_c$ of the substrate BJT may correspond to the drive current $I_{drive}$. For example, a collector current $I_c$ of the substrate BJT Q may be the same as the drive current $I_{drive}$ outputted from the current source 150. That is, even though the base current $I_b$ of the substrate BJT Q varies according to a temperature or the like, the collector current $I_c$ of the substrate BJT Q may be controlled by adjusting the drive current $I_{drive}$ outputted from the current source 150 regardless of the variation of the base current $I_b$ of the substrate BJT Q.

Figure 2:
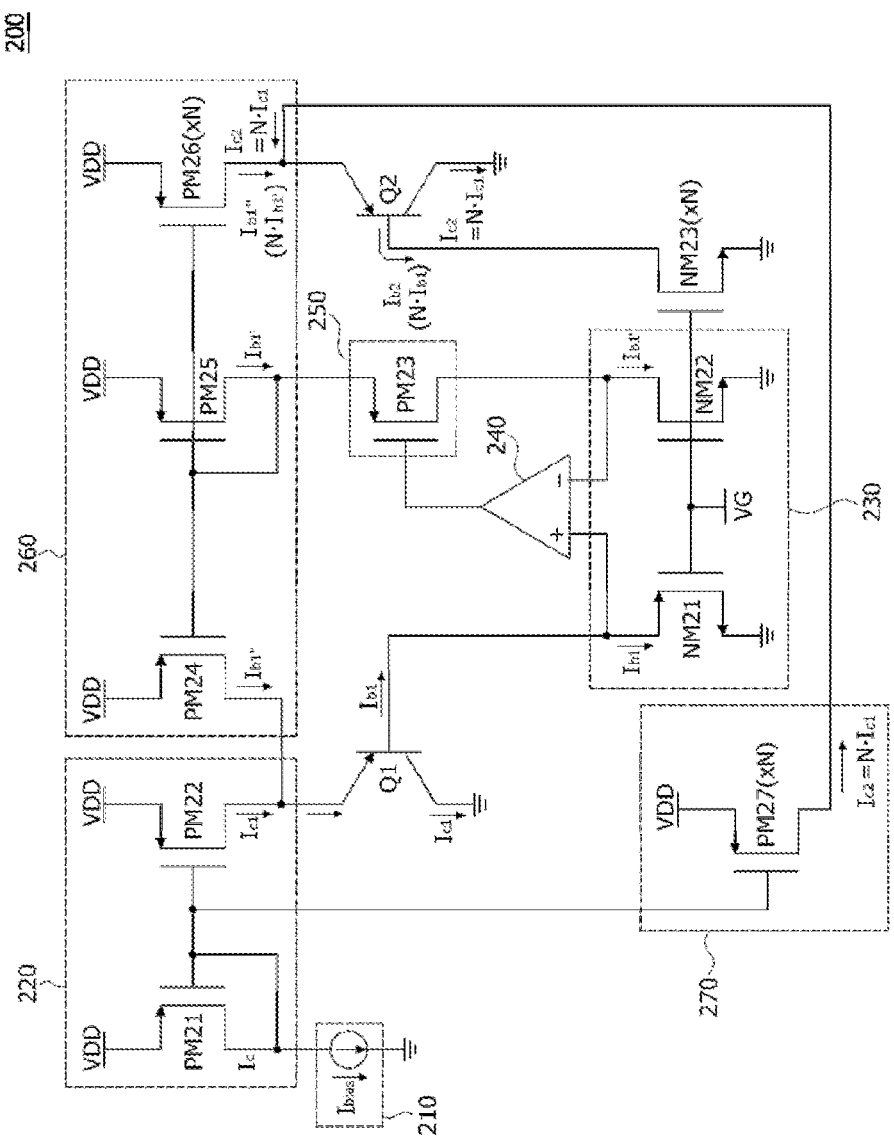
FIG. 2 is a circuit diagram illustrating a circuit for compensating base currents for generating a PTAT voltage according to an embodiment.

FIG. 2 is a circuit diagram illustrating a circuit 200 for compensating base currents for generating a PTAT voltage according to an embodiment. Referring to FIG. 2, the compensation circuit 200 according to an embodiment may be configured to include a first substrate BJT Q1, a second substrate BJT Q2, a current source 210, a first current mirror 220, a second current mirror 230, an operational amplifier 240, a current transmitter 250, a third current mirror 260, and a second collector current transmitter 270. In some embodiments, the first and second substrate BJTs Q1 and Q2 may be integrated on the same substrate and may be formed to have the same area. It may be necessary to realize the first and second substrate BJTs Q1 and Q2 so that a current density of the second substrate BJT Q2 is different from a current density of the first substrate BJT Q1 to generate the PTAT voltage. The circuit 200 according to the present embodiment may be realized so that a base current (i.e., a second base current $I_{b2}$) of the second substrate BJT Q2 is equal to "N" (wherein, "N" denotes a natural number which is greater than one throughout the specification) times a base current (i.e., a first base current $I_{b1}$) of the first substrate BJT Q1, and a collector current (i.e., a second collector current $I_{c2}$) of the second substrate BJT Q2 is equal to "N" times a collector current (i.e., a first collector current $I_{c1}$) of the first substrate BJT Q1 using the circuit 100 described with reference to FIG. 1.

The first substrate BJT Q1 may have a first emitter, a first base, and a first collector. The first emitter of the first substrate BJT Q1 may be coupled to the first current mirror 220 and the third current mirror 260, and a first base of the first substrate BJT Q1 may be coupled to the second current mirror 230. In addition, the first collector of the first substrate BJT Q1 may be coupled to a ground terminal. The second substrate BJT Q2 may have a second emitter, a second base, and a second collector. The second emitter of the second substrate BJT Q2 may be coupled to the third current mirror 260 and the second collector current transmitter 270, and second collector of the second substrate BJT Q2 may be coupled to the ground terminal. In some embodiments, the first and second substrate BJTs Q1 and Q2 may be PNP BJTs. Alternatively, the first and second substrate BJTs Q1 and Q2 may be NPN BJTs. If the first and second substrate BJTs Q1 and Q2 are NPN BJTs, each of MOS transistors described in this embodiment may be construed to have an opposite channel type.

The first current mirror 220 may include a first PMOS transistor PM21 and a second PMOS transistor PM22. A gate of the first PMOS transistor PM21 may be coupled to a gate of the second PMOS transistor PM22. A source and a drain of the first PMOS transistor PM21 may be coupled to a supply voltage VDD terminal and one end of the current source 210, respectively. The other end of the current source 210 may be coupled to the ground terminal. The current source 210 may be disposed so that a bias current $I_{bias}$ generated by the current source 210 flows into the ground terminal. The first PMOS transistor PM21 may have a diode-connected structure in which the gate and the drain of the first PMOS transistor PM21 are connected to each other. A source and a drain of the second PMOS transistor PM22 may be coupled to the supply voltage VDD terminal and the first emitter of the first substrate BJT Q1, respectively. The first current mirror 220 may generate a first collector current $I_{c1}$, and the first collector current $I_{c1}$ may be supplied to the first emitter of the first substrate BJT Q1.

The second current mirror 230 may include a first NMOS transistor NM21 and a second NMOS transistor NM22. The first and second NMOS transistors NM21 and NM22 may have the same current drivability. For example, the first and second NMOS transistors NM21 and NM22 may have the same transconductance (Gm). A gate of the first NMOS transistor NM21 may be coupled to a gate of the second NMOS transistor NM22, and a gate bias voltage VG may be applied to the gates of the first and second NMOS transistors NM21 and NM22. Sources of the first and second NMOS transistors NM21 and NM22 may be coupled to the ground terminal. A drain of the first NMOS transistor NM21 may be coupled to the first base of the first substrate BJT Q1 and a non-inverting input terminal of the operational amplifier 240. A drain of the second NMOS transistor NM22 may be coupled to an inverting input terminal of the operational amplifier 240 and the current transmitter 250. The second current mirror 230 may be realized so that a drain voltage of the first NMOS transistor NM21 is equal to a drain voltage of the second NMOS transistor NM22. Thus, a first base current $I_{b1}$ of the first substrate BJT Q1 may flow through the first NMOS transistor NM21, and a first mirroring base current $I_{b1'}$ corresponding to a duplicate current (i.e., a replicate current) of the first base current $I_{b1}$ may flow through the second NMOS transistor NM22.

The operational amplifier 240 may be used in equalization of the drain voltages of the first and second NMOS transistors NM21 and NM22 of the second current mirror 230. Specifically, the operational amplifier 240 may be disposed to provide a negative feedback loop so that an output signal of the operational amplifier 240 is applied to the current transmitter 250. The operational amplifier 240 and the current transmitter 250 may operate to equalize a voltage of the inverting input terminal of the operational amplifier 240 with a voltage of the non-inverting input terminal of the operational amplifier 240. Thus, the inverting input terminal and the non-inverting input terminal of the operational amplifier 240 may have the same voltage level. As a result, the drains of the first and second NMOS transistors NM21 and NM22 may have the same voltage level.

The current transmitter 250 may be realized using a third PMOS transistor PM23. A gate of the third PMOS transistor PM23 of the current transmitter 250 may be coupled to an output terminal of the operational amplifier 240. A source of the third PMOS transistor PM23 may be coupled to the third current mirror 260. A drain of the third PMOS transistor PM23 may be coupled to the drain of the second NMOS transistor NM22 and the inverting input terminal of the operational amplifier 240. The third PMOS transistor PM23 may be disposed so that the operational amplifier 240 constitutes a negative feedback loop. In addition, the third PMOS transistor PM23 may be disposed to transmit the first mirroring base current $I_{b1'}$ to the third current mirror 260, where the first mirroring base current $I_{b1'}$ is generated by the second current mirror 230.

The third current mirror 260 may include a fourth PMOS transistor PM24, a fifth PMOS transistor PM25, and a sixth PMOS transistor PM26. In some embodiments, the fourth PMOS transistor PM24 may have the same current drivability as the fifth PMOS transistor PM25. In contrast, the sixth PMOS transistor PM26 may have a current drivability which is equal to "N" times a current drivability of the fifth PMOS transistor PM25. For example, a transconductance (Gm) of the sixth PMOS transistor PM26 may be equal to "N" times a transconductance (Gm) of the fifth PMOS transistor PM25. Gates of the fourth, fifth, and sixth PMOS transistors PM24, PM25, and PM26 may be coupled to each other. A source and a drain of the fourth PMOS transistor PM24 may be coupled to the supply voltage VDD terminal and the first emitter of the first substrate BJT Q1, respectively. A source and a drain of the fifth PMOS transistor PM25 may be coupled to the supply voltage VDD terminal and the source of the third PMOS transistor PM23, respectively. The fifth PMOS transistor PM25 may have a diode-connected structure in which the gate and the drain of the fifth PMOS transistor PM25 are connected to each other. A source and a drain of the sixth PMOS transistor PM26 may be coupled to the supply voltage VDD terminal and the second emitter of the second substrate BJT Q2, respectively. The first mirroring base current $I_{b1'}$ transmitted to the fifth PMOS transistor PM25 may cause a second mirroring base current $I_{b1''}$ replicated by the fourth PMOS transistor PM24 and a third mirroring base current $I_{b1'''}$ replicated by the sixth PMOS transistor PM26. In such a case, the second mirroring base current $I_{b1''}$ may be replicated to have the same amount as the first mirroring base current $I_{b1'}$ but the third mirroring base current $I_{1'''}$ may be replicated to have an amount which is equal to "N" times the first mirroring base current $I_{b1'}$.

The second collector current transmitter 270 may be configured to include a seventh PMOS transistor PM27. In some embodiments, the seventh PMOS transistor PM27 may have a current drivability which is equal to "N" times a current drivability of the second PMOS transistor PM22. For example, a transconductance (Gm) of the seventh PMOS transistor PM27 may be equal to "N" times a transconductance (Gm) of the second PMOS transistor PM22. A gate of the seventh PMOS transistor PM27 may be coupled to the gates of the first and second PMOS transistors PM21 and PM22. A source and a drain of the seventh PMOS transistor PM27 may be coupled to the supply voltage VDD terminal and the second emitter of the second substrate BJT Q2, respectively. The second collector current transmitter 270 may supply a second collector current $I_{c2}$ ($N \times I_{c1}$), which is equal to "N" times the first collector current $I_{c1}$ of the first substrate BJT Q1, to the second emitter of the second substrate BJT Q2.

The second base of the second substrate BJT Q2 may be coupled to the ground terminal through a third NMOS transistor NM23. The third NMOS transistor NM23 may have a current drivability which is equal to "N" times the current drivability of the second NMOS transistor NM22. For example, a transconductance (Gm) of the third NMOS transistor NM23 may be equal to "N" times a transconductance (Gm) of the second NMOS transistor NM22. A gate of the third NMOS transistor NM23 may be coupled to the gates of the first and second NMOS transistors NM21 and NM22, and the gate bias voltage VG may also be applied to the gate of the third NMOS transistor NM23. A drain and a source of the third NMOS transistor NM23 may be coupled to the second base of the second substrate BJT Q2 and the ground terminal, respectively. The third NMOS transistor NM23 may provide a current path through which the second base current $I_{b2}$ ($N \times I_{b1}$) flows into the ground terminal.

An operation of the circuit 200 according to an embodiment will be described hereinafter. First, if the supply voltage VDD and the bias current $I_{bias}$ are applied to the circuit 200, a collector current $I_c$ may flow through the first NMOS transistor PM21 and the first collector current $I_n$ corresponding to a replicate current of the collector current $I_c$ may flow through the second NMOS transistor PM22. The first collector current $I_{c1}$ may be substantially the same amount as the collector current $I_c$. However, in some embodiments, an amount of the first collector current $I_{c1}$ may be different than an amount of the collector current $I_c$. The first collector current $I_{c1}$ may be supplied to the first emitter of the first substrate BJT Q1. In the present embodiment, the current source 210 and the first current mirror 220 may have a similar function to the current source 150 of the circuit 100 described with reference to FIG. 1. That is, the first collector current $I_{c1}$ may be controlled by adjusting the bias current $I_{bias}$ generated by the current source 210.

The first base current $I_{b1}$ of the first substrate BJT Q1 may flow into the first NMOS transistor NM21 of the second current mirror 230. Because the operational amplifier 240 provides a negative feedback loop, the drains of the first and second NMOS transistors NM21 and NM22 may have the same voltage level. Thus, the first mirroring base current $I_{b1'}$ corresponding to a duplicate current (i.e., a replicate current) of the first base current $I_{b1}$ may flow through the second NMOS transistor NM22. If the first mirroring base current $I_{b1'}$ flows through the second NMOS transistor NM22, the first mirroring base current $I_{b1'}$ may also flow through the fifth PMOS transistor PM25 due to the presence of the third PMOS transistor PM23 of the current transmitter 250, and the current transmitter 250 may be configured to transmit the first mirroring base current $I_{b1'}$.

The first mirroring base current $I_{b1'}$ may be replicated by the fourth PMOS transistor PM24 of the third current mirror 260 to generate the second mirroring base current $I_{b1'}$ flowing through the fourth PMOS transistor PM24. The second mirroring base current $I_{b1'''}$ generated by the fourth PMOS transistor PM24 and the first collector current $I_{c1}$ generated by the second PMOS transistor PM22 may flow into the first emitter of the first substrate BJT Q1. The second mirroring base current $I_{b1'''}$ may correspond to a replicate current of the first base current $I_{b1}$ of the first substrate BJT Q1. Thus, an amount of the second mirroring base current $I_{b1'''}$ may be substantially equal to an amount of the first base current $I_{b1}$ of the first substrate BJT Q1. As a result, the first collector current $I_{c1}$ of the first substrate BJT Q1 may be substantially the same amount as the first collector current $I_{c1}$ flowing through the second PMOS transistor PM22. That is, even though the first base current $I_{b1}$ of the first substrate BJT Q1 varies according to a temperature or the like, the first collector current $I_{c1}$ of the first substrate BJT Q1 may be controlled by adjusting the bias current $I_{bias}$ outputted from the current source 210 regardless of the variation of the first base current $I_{b1}$ of the first substrate BJT Q1.

In addition, the first mirroring base current $I_{b1'}$ may be replicated by the sixth PMOS transistor PM26 of the third current mirror 260 to generate the third mirroring base current $I_{b1''''}$ flowing through the sixth PMOS transistor PM26. The third mirroring base current $I_{b1''''}$ may have an amount which is equal to "N" times an amount of the first mirroring base current $I_{b1'}$. The third mirroring base current $I_{b1''''}$ may flow from the sixth PMOS transistor PM26 into the second emitter of the second substrate BJT Q2. The third mirroring base current $I_{b1''''}$ ($N \times I_{b1'}$) replicated by the sixth PMOS transistor PM26 and the second collector current $I_{c2}$ ($N \times I_{c1}$) generated by the second collector current transmitter 270 may be supplied to the second emitter of the second substrate BJT Q2.

As described above, a total amount of current flowing through the second emitter of the second substrate BJT Q2 may be substantially the same amount as the third mirroring base current $I_{b1''''}$ ($N \times I_{b1'}$) flowing through the sixth PMOS transistor PM26 and the second collector current $I_{c2}$ ($N \times I_{c1}$) flowing through the second collector current transmitter 270. The third mirroring base current $I_{b1''''}$ ($N \times I_{b1}$) flowing through the sixth PMOS transistor PM26 and into the second emitter of the second substrate BJT Q2 may correspond to the second base current $I_{b2}$ flowing through the second base of the second substrate BJT Q2. Thus, the second collector current $I_{c2}$ ($N \times I_{c1}$) supplied to the second emitter of the second substrate BJT Q2 may flow into the ground terminal through the second collector of the second substrate BJT Q2. The second base current $I_{b2}$ of the second substrate BJT Q2 may have an amount which is equal to "N" times the first base current $I_{b1}$ of the first substrate BJT Q1. In addition, the second collector current $I_{c2}$ of the second substrate BJT Q2 may have an amount which is equal to "N" times the first collector current $I_{c1}$ of the first substrate BJT Q1.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A circuit for controlling a collector current of a substrate bipolar junction transistor (BJT), the circuit comprising:
    a first current mirror configured to generate a first mirroring base current corresponding to a replicate current of a base current of the substrate BJT;
    a current transmitter configured to transmit the first mirroring base current;
    a second current mirror configured to generate a second mirroring base current corresponding to a replicate current of the first mirroring base current received from the current transmitter and configured to supply the second mirroring base current to an emitter of the substrate BJT; and
    a current source configured to supply a drive current corresponding to a collector current of the substrate BJT to the emitter of the substrate BJT.

2. The circuit of claim 1, wherein the substrate BJT is a PNP BJT.

3. The circuit of claim 2, wherein:
    the first current mirror includes a first NMOS transistor and a second NMOS transistor;
    a gate bias voltage is applied to gates of the first and second NMOS transistors, and sources of the first and second NMOS transistors are coupled to a ground terminal;
    a drain of the first NMOS transistor is coupled to a base of the substrate BJT, and a drain of the second NMOS transistor is coupled to the current transmitter; and
    a drain voltage of the first NMOS transistor is equal to a drain voltage of the second NMOS transistor.

4. The circuit of claim 3, further comprising an operational amplifier configured to provide a negative feedback loop so that the drain voltages of the first and second NMOS transistors have the same level.

5. The circuit of claim 4, wherein:
    a non-inverting input terminal and an inverting input terminal of the operational amplifier are coupled to the drain of the first NMOS transistor and the drain of the second NMOS transistor, respectively; and
    an output terminal of the operational amplifier is coupled to the current transmitter.

6. The circuit of claim 5, wherein the current transmitter includes a first PMOS transistor having a gate coupled to the output terminal of the operational amplifier, a source coupled to the second current mirror, and a drain coupled to the drain of the second NMOS transistor.

7. The circuit of claim 6, wherein:
    the second current mirror includes a second PMOS transistor and a third PMOS transistor;
    gates of the second and third PMOS transistors are coupled to each other, and sources of the second and third PMOS transistors are coupled to a supply voltage terminal;
    a drain of the second PMOS transistor is coupled to a source of the first PMOS transistor;
    a drain of the third PMOS transistor is coupled to the emitter of the substrate BJT; and
    the second PMOS transistor has a diode-connected structure in which the gate and the drain of the second PMOS transistor are coupled to each other.

8. A circuit for compensating a base current for generating a PTAT voltage, the circuit comprising:
    a first current mirror configured to supply a first collector current corresponding to a collector current of a first substrate bipolar junction transistor (BJT) to an emitter of the first substrate BJT;
    a second current mirror configured to generate a first mirroring base current corresponding to a replicate current of a base current of the first substrate BJT;
    a current transmitter configured to transmit the first mirroring base current;

a third current mirror configured to generate a second mirroring base current corresponding to a replicate current of the first mirroring base current received from the current transmitter to supply the second mirroring base current to the emitter of the first substrate BJT and configured to generate a third mirroring base current having an amount which is equal to "N" (wherein, "N" denotes a natural number which is greater than one) times an amount of the first mirroring base current to supply the third mirroring base current to an emitter of a second substrate BJT; and a second collector current transmitter configured to supply a second collector current to the emitter of the second substrate BJT where the second collector current amount is equal to "N" times an amount of the first collector current.

9. The circuit of claim 8, wherein the first and second substrate BJTs are PNP BJTs.

10. The circuit of claim 9, wherein:
the first current mirror includes a first PMOS transistor and a second PMOS transistor;
gates of the first and second PMOS transistors are coupled to each other, and sources of the first and second PMOS transistors are coupled to a supply voltage terminal;
the first PMOS transistor has a diode-connected structure in which the gate and the drain of the first PMOS transistor are coupled to each other; and
a drain of the second PMOS transistor is coupled to the emitter of the first substrate BJT.

11. The circuit of claim 10, further comprising a current source coupled between the drain of the first PMOS transistor and a ground terminal.

12. The circuit of claim 10, wherein:
the second current mirror includes a first NMOS transistor and a second NMOS transistor;
a gate bias voltage is applied to gates of the first and second NMOS transistors, and sources of the first and second NMOS transistors are coupled to a ground terminal;
a drain of the first NMOS transistor is coupled to a base of the first substrate BJT, and a drain of the second NMOS transistor is coupled to the current transmitter; and
a drain voltage of the first NMOS transistor is equal to a drain voltage of the second NMOS transistor.

13. The circuit of claim 12, further comprising an operational amplifier configured to provide a negative feedback loop so that the drain voltages of the first and second NMOS transistors have the same level.

14. The circuit of claim 13, wherein:
a non-inverting input terminal and an inverting input terminal of the operational amplifier are coupled to the drain of the first NMOS transistor and the drain of the second NMOS transistor, respectively; and
an output terminal of the operational amplifier is coupled to the current transmitter.

15. The circuit of claim 14, wherein the current transmitter includes a third PMOS transistor having a gate coupled to the output terminal of the operational amplifier, a source coupled to the third current mirror, and a drain coupled to the drain of the second NMOS transistor.

16. The circuit of claim 15, wherein:
the third current mirror includes a fourth PMOS transistor, a fifth PMOS transistor and a sixth PMOS transistor;
gates of the fourth, fifth and sixth PMOS transistors are coupled to each other, and sources of the fourth, fifth and sixth PMOS transistors are coupled to a supply voltage terminal;
a drain of the fourth PMOS transistor is coupled to the emitter of the first substrate BJT;
a drain of the fifth PMOS transistor is coupled to a source of the third PMOS transistor;
a drain of the sixth PMOS transistor is coupled to the emitter of the second substrate BJT; and
the fifth PMOS transistor has a diode-connected structure in which the gate and the drain of the fifth PMOS transistor are coupled to each other.

17. The circuit of claim 16, wherein the sixth PMOS transistor has a current drivability which is equal to "N" times a current drivability of the fifth PMOS transistor.

18. The circuit of claim 17, wherein the second collector current transmitter includes a seventh PMOS transistor having a current drivability which is equal to "N" times a current drivability of the second PMOS transistor.

19. The circuit of claim 18, wherein the seventh PMOS transistor has a gate coupled to the gates of the first and second PMOS transistors, a source coupled to the supply voltage terminal, and a drain coupled to the emitter of the second substrate BJT.

20. The circuit of claim 19, further comprising a third NMOS transistor coupled between the base of the second substrate BJT and a ground terminal.

21. The circuit of claim 20, wherein the third NMOS transistor has a current drivability which is equal to "N" times a current drivability of the second NMOS transistor.

22. The circuit of claim 21, wherein the third NMOS transistor has a gate to which the gate bias voltage is applied, a drain coupled to the base of the second substrate BJT, and a source coupled to the ground terminal.

* * * * *